US012598773B2

(12) United States Patent
Bellini et al.

(10) Patent No.: US 12,598,773 B2
(45) Date of Patent: Apr. 7, 2026

(54) TRENCH SIC POWER SEMICONDUCTOR DEVICE

(71) Applicant: Hitachi Energy Ltd, Zürich (CH)

(72) Inventors: Marco Bellini, Zürich (CH); Lars Knoll, Hägglingen (CH)

(73) Assignee: HITACHI ENERGY LTD, Zürich (CH)

( * ) Notice: Subject to any disclaimer, the term of this patent is extended or adjusted under 35 U.S.C. 154(b) by 420 days.

(21) Appl. No.: 18/026,790

(22) PCT Filed: Oct. 8, 2021

(86) PCT No.: PCT/EP2021/077905
§ 371 (c)(1),
(2) Date: Mar. 16, 2023

(87) PCT Pub. No.: WO2022/078908
PCT Pub. Date: Apr. 21, 2022

(65) Prior Publication Data
US 2023/0327014 A1    Oct. 12, 2023

(30) Foreign Application Priority Data
Oct. 14, 2020    (EP) .................................... 20201762

(51) Int. Cl.
*H10D 30/66*        (2025.01)
*H01L 21/04*        (2006.01)
(Continued)

(52) U.S. Cl.
CPC ......... *H10D 30/668* (2025.01); *H10D 12/031* (2025.01); *H10D 62/102* (2025.01); *H10D 62/8325* (2025.01)

(58) Field of Classification Search
CPC .. H10D 30/668; H10D 12/031; H10D 62/102; H10D 62/8325; H10D 64/256; H10D 62/393; H01L 21/046
See application file for complete search history.

(56) References Cited

U.S. PATENT DOCUMENTS

| 7,355,223 B2 | 4/2008 | Harris et al. |
| 7,691,711 B2 | 4/2010 | Stum et al. |
| | (Continued) | |

FOREIGN PATENT DOCUMENTS

| DE | 102005052731 A1 | 5/2006 |
| EP | 2091083 A2 | 8/2009 |
| | (Continued) | |

*Primary Examiner* — Herve-Louis Y Assouman
(74) *Attorney, Agent, or Firm* — PROCOPIO, CORY, HARGREAVES & SAVITCH LLP

(57) ABSTRACT

A power semiconductor device comprises a drift layer of a first conductivity type, a source layer of the first conductivity type on the drift layer, with an insulated trench gate electrode which extends through the source layer into the drift layer, and an implant layer of a second conductivity type different than the first conductivity type with a homogeneous doping region having a doping variation of at most 8%. The homogeneous doping region is arranged between the source layer and the drift layer and has a homogeneous doping region thickness of at least 150 nm. A method is provided for producing a power semiconductor device with an insulated trench gate electrode.

18 Claims, 6 Drawing Sheets

(51) Int. Cl.

| | | |
|---|---|---|
| *H10D 12/01* | (2025.01) | |
| *H10D 30/01* | (2025.01) | |
| *H10D 62/10* | (2025.01) | |
| *H10D 62/17* | (2025.01) | |
| *H10D 62/832* | (2025.01) | |
| *H10D 64/23* | (2025.01) | |

(56) References Cited

U.S. PATENT DOCUMENTS

| | | | | |
|---|---|---|---|---|
| 7,932,136 | B2 | 4/2011 | Hua et al. | |
| 2004/0145011 | A1 | 7/2004 | Hsu et al. | |
| 2007/0210316 | A1* | 9/2007 | Yonezawa | H10D 62/117 |
| | | | | 257/77 |
| 2009/0026532 | A1 | 1/2009 | Schilling et al. | |
| 2015/0179636 | A1 | 6/2015 | Pfirsch et al. | |
| 2020/0203482 | A1* | 6/2020 | Kaji | H10D 12/031 |
| 2020/0273970 | A1* | 8/2020 | Okuda | H10D 12/038 |

FOREIGN PATENT DOCUMENTS

| | | | |
|---|---|---|---|
| JP | 2008-210848 | A | 9/2008 |
| JP | 2018-98447 | A | 6/2018 |
| JP | 2018-110166 | A | 7/2018 |
| WO | 2014/207793 | A1 | 12/2014 |

* cited by examiner

TRENCH SIC POWER SEMICONDUCTOR DEVICE

CROSS-REFERENCE TO RELATED APPLICATIONS

The present application is a national stage entry of International Patent Application No. PCT/EP2021/077905, filed on Oct. 8, 2021, which claims priority to European Patent Application No. 20201762.0, filed on Oct. 14, 2020, which are both hereby incorporated herein by reference as if set forth in full.

TECHNICAL FIELD

The invention relates to a silicon carbide (SiC) power semiconductor device with an insulated trench gate electrode and to a method for manufacturing a silicon carbide power semiconductor device with an insulated trench gate electrode. For instance, the power semiconductor device is a SiC trench MOSFET (metal-oxide-semiconductor field-effect transistor) or a SiC trench IGBT (insulated gate bipolar transistor).

BACKGROUND ART

Given that in SiC dopants do not diffuse and given that source implants have long tails, it is very challenging to design the source and channel implants of a trench device to reach optimal performance. This is especially true for a trench MOSFET where the source layer and the channel layer lie on top of each other.

For planar devices, the channel profile is designed so that the surface concentration in the first 100 nm in depth, i.e. in the direction orthogonal to the gate oxide, is used to achieve the desired threshold voltage. The profile peak is used to shield the low doped channel from the peak of the electric field, enabling more freedom of tuning of the threshold voltage through the surface channel doping with decoupling from the depletion of the channel doping at high voltage. The channel length in planar devices is determined by gate spacers but in the case of trench devices it will be designed through implantation.

In a trench power semiconductor device, however, it is difficult to obtain appropriate source and channel layers by means of implantation, because the long tail typical of the source implantation extends into the underlying channel layer with a doping concentration that is comparable to or even larger than the channel doping.

SUMMARY OF INVENTION

It is therefore an object of the invention to provide an improved trench power semiconductor device and an improved method for manufacturing the trench power semiconductor device. Exemplarily, it is an object of the invention to overcome any of the previously mentioned difficulties for a trench MOSFET design.

The object of the invention is solved by the features of the independent claims. Modified embodiments are detailed in the dependent claims.

According to at least one embodiment, a method for manufacturing a Silicon Carbide power semiconductor device with an insulated trench gate electrode comprises the steps of:

providing a drift layer of a first conductivity type;

forming a source layer of the first conductivity type on the drift layer;

forming the insulated trench gate electrode which extends through the source layer into the drift layer; and implanting ions of a second conductivity type, which is different than the first conductivity type into the drift layer to produce an implant layer of the second conductivity type with a homogeneous doping region having a doping variation of at most 8%, wherein the homogeneous doping region is arranged between the source layer and the drift layer and has a homogeneous doping region thickness of at least 150 nm.

The first conductivity type may be n-type and the second conductivity type may be p-type. In this case, the drift layer is an n-doped layer. Alternatively, the first conductivity type is p-type and the second conductivity type is n-type.

The term layer is not limited to an element formed on an underlying material, for instance by a coating or deposition process, but also includes a subregion of an element that differs from one or more adjacent subregions of the same element, for instance with respect to at least one of the material composition and the doping concentration. For example, differently doped subregions of a semiconductor wafer or of a semiconductor body formed from a semiconductor wafer are referred to as layers as well.

The method may comprise steps according to any of the modified embodiments which are described below. The method steps can be carried out in any order to each other. Exemplarily, the method steps are carried out in a sequence as described below:

First, the method comprises a step of providing a drift layer of the first conductivity type. For example, the drift layer is part of a SiC wafer. The SiC wafer may comprise further layers. For example, the drift layer forms a surface of the SiC wafer.

After the step of providing the drift layer, the method comprises a step of forming a source layer of the first conductivity type on the drift layer. For example, the source layer is formed directly on the surface of the SiC wafer.

After the step of forming the source layer on the drift layer, the method comprises a step of forming an insulated trench gate electrode which extends through the source layer into the drift layer.

The method further comprises a step of implanting ions of a second conductivity type different than the first conductivity type into the drift layer to produce an implant layer with a homogenous doping region having a doping variation of at most 8%, wherein the homogenous doping region is arranged between the source layer and the drift layer and has a homogenous doping region thickness of at least 150 nm. The doping concentration profile with a variation of at most 8% is obtained by defining a flat region in the implant layer, which is defined by mathematical optimization for example. For instance, the doping concentration is maximally flat in a depth of the first 0 nm to 400 nm. This method step is formed after the formation of the source layer, for instance. The implantation of ions may be performed prior to or after the formation of the insulated trench gate electrode.

For example, the step of implanting ions includes a plurality of implantation substeps with different ion energies. Thus, the resulting doping profile within the implant layer is formed by a superposition of single implants. For instance, the energy and the dosis of the implanted ions is varied for each substep. For example, a mathematical optimization of the dosis and the energy for each substep allows to form the doping profile in vertical direction such that the homogenous doping region is obtained. For instance, the number of substeps is at least 2 or at least 3 and/or at most 20 or at most 10. For example, the energy is in an energy range from 10 to 400 keV for each substep. For instance, a higher energy results in a larger depth of the implanted ions.

According to at least one embodiment, the step of implanting ions includes implanting ions for different depths wherein the doses for the different depths are obtained based on a numerical optimization.

Furthermore, a power semiconductor device is specified.

According to at least one embodiment, the power semiconductor device comprises a drift layer of a first conductivity type, a source layer of the first conductivity type on the drift layer, an insulated trench gate electrode which extends through the source layer into the drift layer and an implant layer of a second conductivity type different than the first conductivity type. The implant layer comprises a homogeneous doping region having a doping variation of at most 8%, which homogeneous doping region is arranged between the source layer and the drift layer and has a homogeneous doping region thickness of at least 150 nm.

For example, the power semiconductor device is configured for operating at large electrical currents, for instance of at least hundred amperes and/or voltages of at least 1000V.

The insulated trench gate electrode may comprise an electrically conductive gate layer and a gate insulation layer. The gate insulation layer may surround the electrically conductive gate layer such that the electrically conductive gate layer is separated from any n- and p-doped layer in the semiconductor device. Exemplarily, the gate layer is completely embedded in the gate insulation layer.

The insulated trench gate electrode is arranged in the same plane as the implant layer in a recess in the semiconductor material, which extends into the drift layer, and is adjacent to the source layer, separated from each other by the gate insulation layer, which also separates the gate layer from the drift layer. Exemplarily, the gate insulation layer is also arranged on top of the gate layer, thus insulating the gate layer from the source electrode.

For example, the power semiconductor device is a trench MOSFET.

A trench MOSFET (metal-oxide-semiconductor field-effect transistor) comprises on a source side a source layer of a first conductivity type and a channel layer (or channel implant or implant layer) of a second conductivity type different from the first conductivity type. A contact in form of a source electrode contacts the source layer and the channel layer. A trench gate electrode is arranged on the source side lateral to the source layer and the channel layer.

"Lateral" direction shall mean a direction parallel to the source side. Compared to a planar MOSFET having the trench gate electrode on top of the source side of the semiconductor layers, higher cell densities may be obtained by trench MOSFETs.

The MOSFET may further comprise a drift layer of the first conductivity type and a drain layer of the first conductivity type which is higher doped than the drift layer. The drain layer may contact a contact in form of a drain electrode.

Like other field-effect transistors, the MOSFET acts as a voltage-controlled resistor, which means that the gate-source voltage can be used to change the resistance between the drain and source, and thus the current by the resistance by several orders of magnitude. The key to understanding this resistance change in a MOS structure is the creation of a conductive channel controlled by the gate.

A power MOSFET is a specialized version of a metal oxide semiconductor field-effect transistor optimized for conducting and blocking large electrical currents, for example of at least hundred amperes, for instance up to several hundred amperes. Alternatively or in addition the voltages may amount to 1000 volts or more.

For example, the power semiconductor device is a trench IGBT.

A trench IGBT (insulated gate bipolar transistor) comprises on a source side (also called emitter side) a source layer (also called emitter layer) of a first conductivity type and an implant layer (also called channel implant or base layer) of a second conductivity type different from the first conductivity type. A contact in form of a source electrode (also called emitter electrode) contacts the source layer and the channel layer. A trench gate electrode is arranged on the source side lateral to the source layer and the channel implant.

The IGBT may further comprise a drift layer of the first conductivity type and a collector layer of the second conductivity type which is higher doped than the drift layer. The collector layer contacts a contact in form of a collector electrode.

Silicon Carbide (SiC) is a wide band gap material having a maximum breakdown electric field larger than that of silicon by about one order of magnitude. SiC is considered as an advantageous material for use in the manufacture of power semiconductor devices such as MOSFETs or IGBTs. For instance, voltages of up to 6.5 kV may been obtained for silicon carbide MOSFETs.

An optimal doping concentration profile for an implant layer acting as channel in a MOSFET, for instance, may be, for example, obtained through mathematical optimization to be maximally flat in the first 200 nm. "Maximally flat variation" means that a variation of the channel doping concentration profile in the homogenous doping region of the channel implant is lower than a variation of the channel doping concentration profile in the other areas of the channel. The variation of the channel doping concentration in the homogenous doping region of the channel implant is at most 8%. This enables an excellent control of the threshold voltage along the channel. The channel length being in the vertical direction for trench devices is chosen by selecting the appropriate implantation energy. For example, (numerical or mathematical) optimization is carried out using a desired surface concentration and its acceptable variation as constraints in order to obtain the doses of each implant.

Using the described method an implant layer of the second conductivity type can be obtained that comprises a homogeneous doping region. Within the implant layer the dopant concentration of the second conductivity type is significantly larger than the dopant concentration of the first conductivity type that may be caused by a tail of the source doping extending into the implant layer. Consequently, the variability of the effective doping profile is reduced. Furthermore, a vulnerability to drain-induced barrier lowering (DIBL) can be reduced.

According to a modified embodiment, the channel doping concentration profile of the homogenous doping region has a concentration in the range from $2 \times 10^{17}$ $1/cm^3$ to $9 \times 10^{17}$ $1/cm^3$. Thereby, a low threshold voltage can be achieved.

According to a modified embodiment, the homogeneous doping region thickness is at least 200 nm. Thereby, a low threshold voltage can be obtained.

According to a modified embodiment, the homogeneous doping region thickness is at most 400 nm. This also promotes a well-controlled and uniform threshold voltage.

According to a modified embodiment of the invention, a variation of the doping in the homogeneous doping region is at most 4%. This even more improves the control of the threshold voltage along the implant layer that may act as a channel, for instance.

According to a modified embodiment of the invention, least one of the following criteria applies:

the source layer has a thickness between 50 nm and 150 nm, the source layer has a thickness between 100 nm and 150 nm, the source layer has a doping concentration between $1\times10^{18}$ $1/cm^3$ and $1\times10^{20}$ $1/cm^3$.

According to a modified embodiment of the invention, the step of forming the insulated trench gate electrode through the source layer into the drift layer is carried out before the step of implanting ions to the drift layer to produce an implant layer or after the step of implanting ions to the drift layer to produce the implant layer. Thus, the procedural steps can be carried out very flexibly. This makes it possible to harmonise the manufacturing process with other manufacturing steps to be carried out. This has the advantage of allowing more implementation possibilities.

According to a modified embodiment of the invention, before or after the step of implanting ions into the drift layer, the method comprises a step of partially removing the source layer such that a section of the drift layer is uncovered. This also improves that the procedural steps can be carried out very flexibly. This makes it possible to harmonise the manufacturing process with other manufacturing steps to be performed. This has the benefit of offering more implementation flexibility.

According to a modified embodiment of the invention, the step of forming the source layer is made by epitaxial growth. Using epitaxial growth the doping concentration can be controlled extremely well, for instance with deviations of at most 10% across the full wafer from the desired nominal doping value. Uniformity on a microscopic scale may be even higher. Furthermore, profiles with abrupt changes in the doping concentration may be obtained. Thus, in contrast to doping using implantation, unintended tails in the doping concentration extending into the adjacent semiconductor material may be reduced or avoided. For instance, the doping concentration of an epitaxially grown doped layer such as the source layer may decrease within the adjacent semiconductor material to a value of 50% of the doping concentration of the doped layer within 20% of a thickness of the doped layer.

For example, in a later step, the source layer is partially removed so that the underlying semiconductor material is uncovered in a section. For instance, at least a part of the source electrode is formed laterally beside the source layer on the uncovered semiconductor material that represents the implant layer in the finished device. For example, the source electrode directly adjoins the implant layer. The partial removal of the source layer may be formed prior to or after the formation of the implant layer. For example, the entire semiconductor material present on top of the implant layer in the finished device is free of implants.

Consequently, pronounced source tails may be reduced or avoided. Such pronounced source tails would complicate the channel and enhancement profile design as the channel doping needs to compensate for both the source and the enhancement tail.

The method described above is suited for manufacturing the power semiconductor device described above, for instance. Therefore, features described in connection with the method also apply for the power semiconductor device and vice versa.

BRIEF DESCRIPTION OF DRAWINGS

These and other aspects of the invention will be apparent from and elucidated with reference to the exemplary embodiments described hereinafter.

In the drawings.

DESCRIPTION OF EXEMPLARY EMBODIMENTS

Figure 1A:
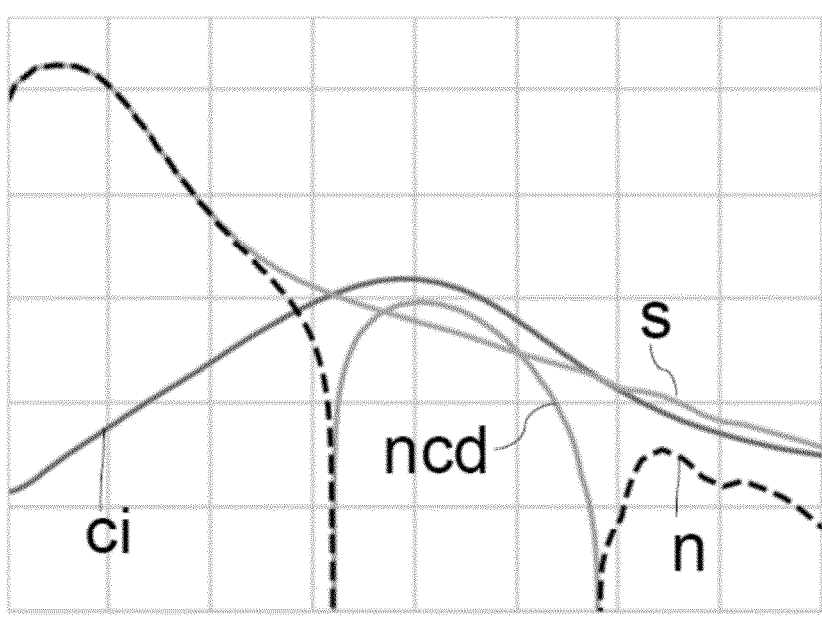
FIG. 1a shows a schematic depth profile for concentrations of an implant layer, a net channel doping, a source and a net source according to the prior art.
Figure 1B:
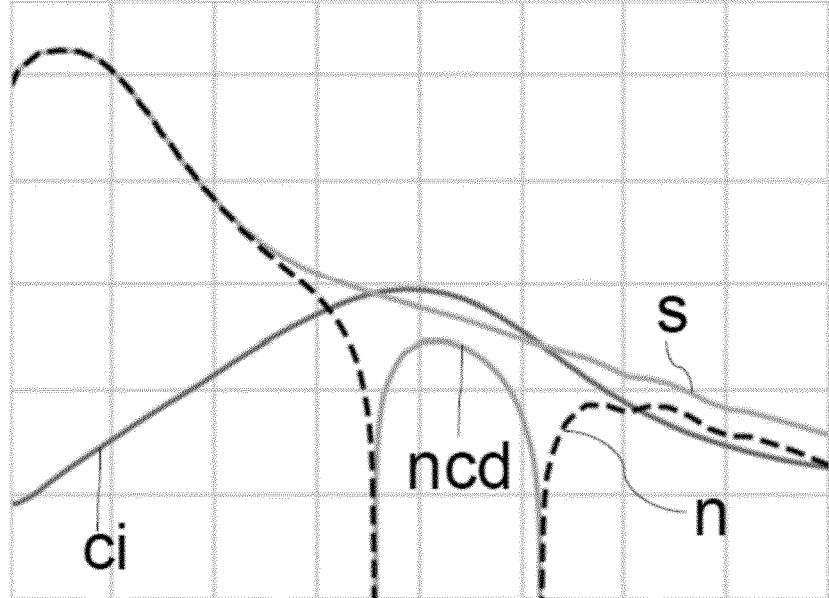
FIG. 1b shows another schematic depth profile for concentrations of an implant layer, a net channel doping, a source and a net source according to the prior art.

FIG. 1a and FIG. 1b show a schematic depth profile for concentrations a channel implant (ci), a net channel doping (ncd), a source (s) and a net source (n) according to the prior art. The net channel doping results from the subtraction of the actual implanted channel dopants, that means the p dopants, minus the implanted source, that means the n dopants, as the n dopants compensate locally the p dopants. Thus, the resulting "net channel" is lower in concentration and shorter in length. The same applies for the source.

Based on FIG. 1a and FIG. 1b, several difficulties of achieving a satisfactory channel implant profile are illustrated: As shown in FIG. 1a, the p channel implant should be significantly higher than the tail of the n source so that variability of the effective profile is reduced. Achieving low threshold voltage requires a surface concentration approximately $3\times10^{17}$ to $5\times10^{17}$, which is in contrast with the previous aspect. Channel length and doping is not independent. Furthermore, the profile of FIG. 1a has lower doping and lower channel length. Therefore, it will be highly vulnerable to drain induced barrier lowering (DIBL). Furthermore, the short channel length and low doping will not guarantee blocking as it will deplete too easily.

The DIBL effect is a short-channel effect in MOSFETs, which in its original form refers to a reduction of the threshold voltage of a normally blocking transistor at a higher drain bias voltage. In a classical planar field effect transistor with a long channel, such as a channel with a channel length of approximately more than 1 μm, the narrowing of the channel occurs far enough away from the drain contact so that the combination of substrate and gate shields it electrostatically against the drain and the threshold voltage is independent of the drain bias voltage. This is no longer the case with shorter channels. The drain is close enough to affect the channel, so that a high drain bias voltage can turn on the transistor prematurely. Furthermore, as shown in FIG. 1b, part of the tail implant may be present after the channel, realizing a low doped enhancement layer.

Figure 2:
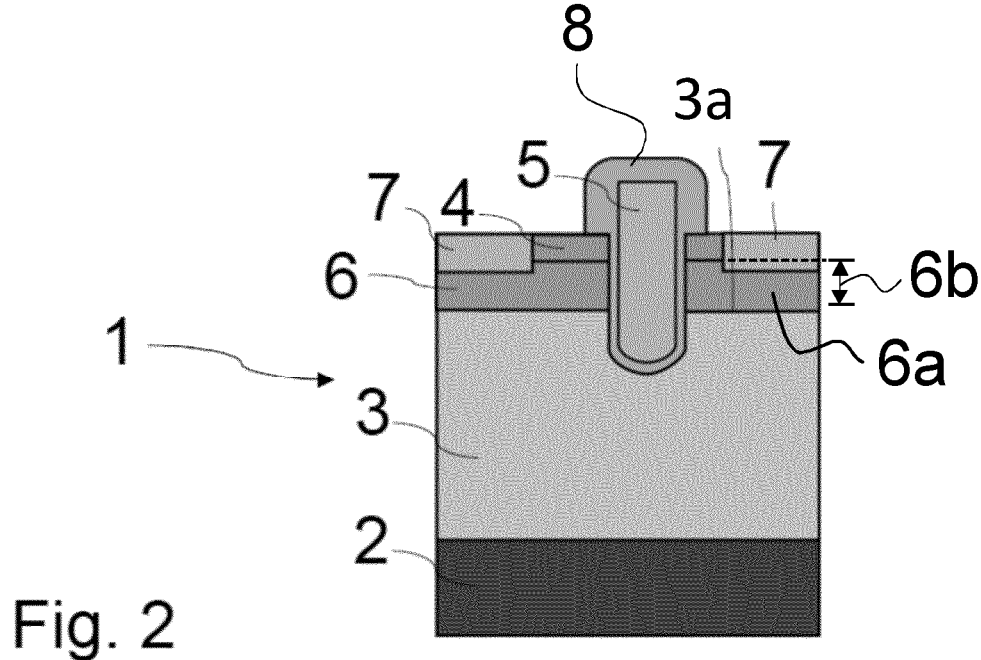
FIG. 2 shows a power semiconductor device according to an exemplary embodiment of the invention.

FIG. 2 shows a MOSFET as an example of a power semiconductor device 1 according to an exemplary embodiment of the invention.

The semiconductor power device 1 comprises a drift layer 3 of a first conductivity type and a source layer 4 of the first conductivity type. An implant layer 6 acting as a channel implant is arranged between the drift layer 3 and the source layer 4. On a source side of the semiconductor power device 1a source electrode 7 electrically contacts the source layer 4 and the implant layer 6. The source electrode 7 is arranged laterally beside the source layer 4. The source electrode 7 directly adjoins the implant layer 6.

On a side of the semiconductor power device opposite the source side, the semiconductor power device 1 comprises a bottom layer 2. In a MOSFET, the bottom layer is of the first conductivity type and acts as a drain layer. An electrode electrically contacting the bottom layer is not explicitly shown for the sake of simplicity.

The bottom layer 2, the drift layer 3 and the implant layer 6 may be formed by differently doped partial regions of a SiC substrate (or wafer). Source layer 4 is a SiC layer that is deposited on the substrate, for instance epitaxially.

The semiconductor power device 1 further comprises an insulated trench gate electrode 5 with a gate insulation layer 8 that electrically insulates an electrically conductive gate layer of the insulated gate electrode 5 from the source layer 4, the implant layer 6 and the drift layer 3. The insulated trench gate electrode 5 extends through the source layer 4 and the implant layer 6 into the drift layer 3.

In this exemplary embodiment as well as in the following exemplary embodiments, the first conductivity type is n-type and the second conductivity type is p-type. Thus, the drift layer 3 is an n-doped layer and the source layer 4 is n-type. The implanted ions and the implant layer 6 are p-type. However, the device structure may also be inverted with respect to conductivity in all exemplary embodiments, so that the first conductivity type is p-type and the second conductivity type is n-type.

The implant layer comprises a homogeneous doping region 6a which is arranged between the source layer 4 and the drift layer 3. As illustrated in FIG. 2 using an arrow, in a direction perpendicular to the source side of the semiconductor power device 1 the homogeneous doping region 6a has a homogeneous doping region thickness 6b of at least 150 nm. Within the homogeneous doping region 6a the doping variation amounts to at most 8% or to at most 4%. For example, the homogeneous doping region 6a extends between the source layer 4 and a transition 3a between the drift layer 3 and the implant layer 6, wherein the homogeneous doping region 6a may be thinner than the implant layer 6. For example, the homogeneous doping region 6a is spaced apart from the transition 3a.

The power semiconductor device 1 may also be a different type of trench power semiconductor device, for instance a trench IGBT. In an IGBT, the bottom layer 2 is of the second conductivity type and acts as a collector layer.

Figures 3A, 3B:
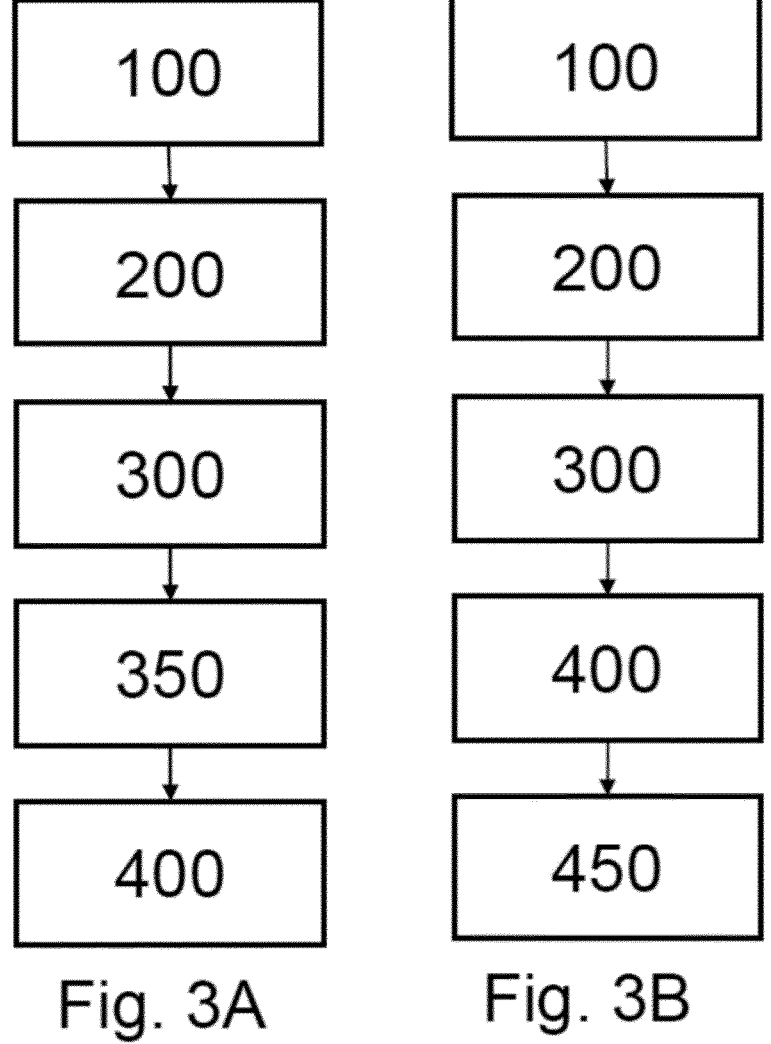
FIG. 3A shows a flow diagram of a method according to a first exemplary embodiment of the invention.
FIG. 3B shows a flow diagram of a method according to a second exemplary embodiment of the invention.

FIG. 3A shows a flow diagram of a method according to a first embodiment of the invention. The method is appropriate for producing a trench Silicon Carbide (SiC) power semiconductor device 1 such as a MOSFET or IGBT (see FIG. 2). The power semiconductor device 1 produced by this method comprises the drift layer 3, the source layer 4, the insulated trench gate electrode 5, a channel layer 6 and the source electrode 7.

The method comprises the following steps:

According to a step indicated by the reference number "100", the method comprises providing a drift layer 3 of a first conductivity type (see FIG. 4A), for example as partial region of a substrate 9.

According to a step indicated by the reference number "200", the method comprises forming a source layer 4 of the first conductivity type on the drift layer 3 (see FIG. 4A) by means of epitaxial growth.

Figures 4A, 4B, 4C, 4D:
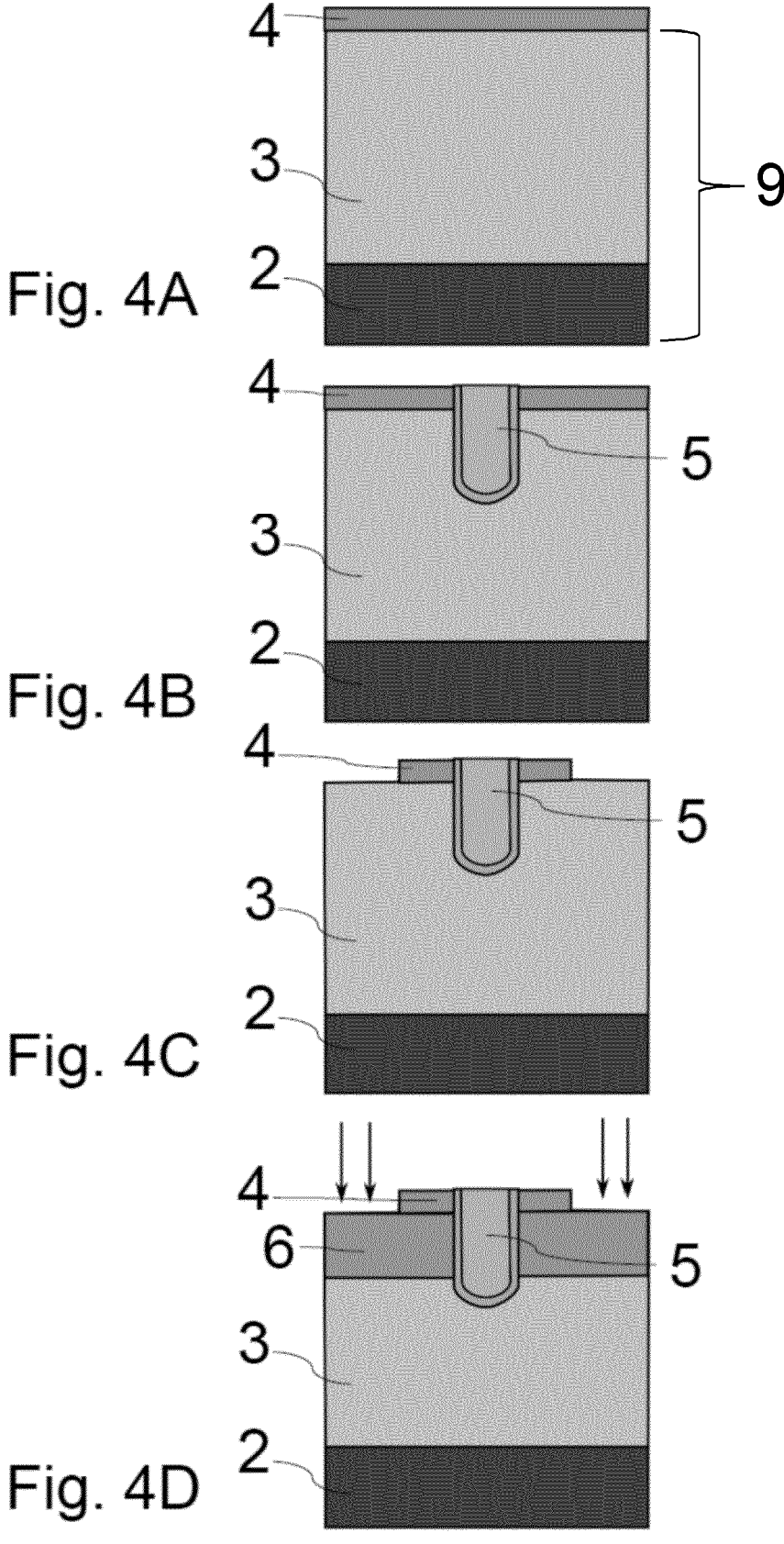
FIG. 4A schematically shows a first method step according to the first exemplary embodiment of the invention.
FIG. 4B schematically shows a second method step according to the first exemplary embodiment of the invention.
FIG. 4C schematically shows a third method step according to the first exemplary embodiment of the invention.
FIG. 4D schematically shows a fourth method step according to the first exemplary embodiment of the invention.

According to a step indicated by the reference number "300", the method comprises forming an insulated trench gate electrode 5 extending through the source layer 4 into the drift layer 3 (see FIG. 4B).

According to a step indicated by the reference number "350", the method comprises partially removing the source layer 4 such that a section of the drift layer 3 is uncovered (see FIG. 4C). Alternatively, the method comprises a step indicated by the reference number "450", which is carried out after the method step "400" (see FIG. 4B, in which a flow diagram of the method according to the second embodiment is shown). According to this step indicated by the reference number "450", the method comprises partially removing the source layer 4 such that a section of the drift layer 3 is uncovered.

According to a step indicated by the reference number "400", the method comprises implanting ions of a second conductivity type different than the first conductivity type into the drift layer 3 to produce an implant layer 6.

A doping concentration profile of the implant layer 6 comprises a homogenous doping region which is defined by mathematical optimization to be maximally flat in a depth of the first 0 nm to 400 nm, wherein the depth is taken from a surface of the drift layer on which the source layer 4 is formed. The region is located adjacent to the outer surface 3a of the drift layer 3.

Finally, the step "300" of forming the insulated trench gate electrode 5 through the source layer 4 into the drift layer 3 may be carried out before the step "400" of implanting ions into the drift layer 3 to produce an implant layer 6. Alternatively, the step "300" of forming the insulated trench gate electrode 5 through the source layer 4 into the drift layer 3 may be carried out after the step "400" of implanting ions into the drift layer 3 to produce an implant layer 6. In the latter case, implantation through the gate oxide layer may be prevented. The implantation of the n source to produce the implant layer is illustrated in FIG. 4D.

Figure 5:
FIG. 5 shows a schematic depth profile of a channel doping concentration according to an exemplary embodiment of the invention.
Figure 5:
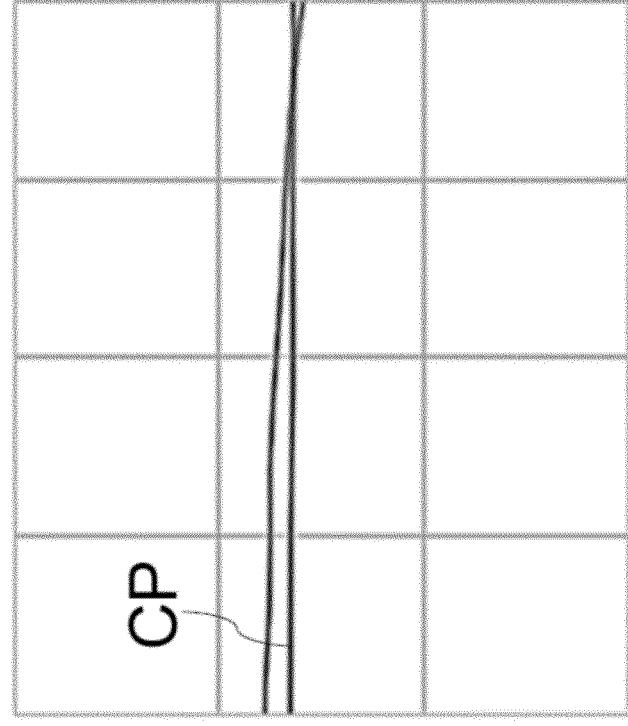

FIG. 5 shows a schematic depth profile of an implant layer doping concentration according to an embodiment of the invention. The graph on the right side shows a depth profile for a depth of 0.00 μm to 1.50 μm. The graph on the left shows a depth profile for a depth of 0.00 μm to 0.20 μm. The curve marked "CP" shows the profile of an implant layer doping concentration for different depths on a logarithmic scale. The implant layer doping concentration is, for example maximally flat in a concentration range from $10^{17}$ to $10^{18}$ 1/cm$^3$ for a depth from 0.00 µm to 0.20 µm thereby providing a homogenous doping region 6a. The curves with dashed lines in the graph on the right side represent the concentrations of the doping on a logarithmic scale for different energies in keV, such as in an energy range from 10 to 400 keV. The curves for the doping concentration for lower energies tend to run at lower depths. All curves have been determined by a profile design technique based on numerical optimization. For example, optimization is carried out using a desired surface concentration and its acceptable variation as constraints in order to obtain the doses of each implant. The profile of the implant layer doping concentration CP results from a superposition of the curves with dashed lines representing different implantation substeps.

Figure 6:
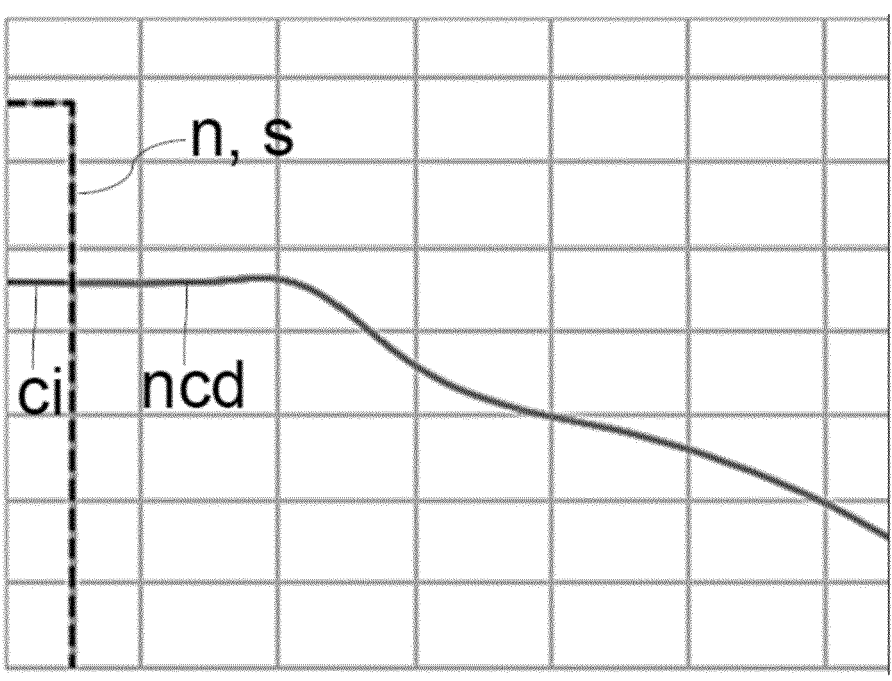
FIG. 6 shows a schematic depth profile for concentrations of an implant layer, a net channel doping, a source and a net source according to an exemplary embodiment of the invention.

FIG. 6 shows a schematic depth profile for concentrations the implant layer 6 acting as channel implant, a net channel doping, a source and a net source according to an exemplary embodiment of the invention on a logarithmic scale. Here a profile of the concentration in 1/cm$^3$ for a depth range from 0.00 µm to 1.3 µm is shown. For example, the source (s) and net source (n) have, for a depth range from 0.00 µm to 0.10 µm, a concentration in a range from $10^{19}$ to $10^{20}$ 1/cm$^3$. At a depth of 0.10 µm, which corresponds to the thickness of the source layer in this exemplary embodiment, the doping concentration of the source (s) abruptly decreases. This can be obtained by epitaxial deposition of the source layer 4, for instance, so that it is not necessary to form the source layer 4 by implantation. Furthermore, the implant layer 6 acting as channel implant (ci) has, for a depth range from 0.00 µm to 0.10 µm, and net channel doping (ncd) has, for a depth range from 0.10 µm to about 0.40 µm, a concentration in a range from $10^{17}$ to $10^{18}$ 1/cm$^3$. In this depth range, a homogenous doping region 6a is formed. Furthermore, the net channel doping (ncd) has, for a depth range from 0.40 µm to about 1.30 µm a concentration decreasing to a range from $10^{14}$ to $10^{15}$ 1/cm$^3$.

Figure 7:
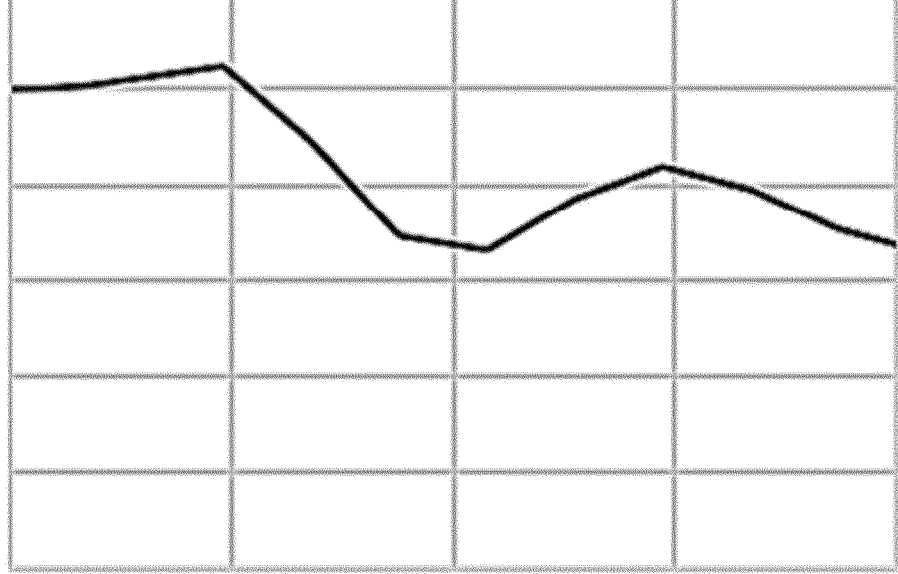
FIG. 7 shows a schematic depth profile of a channel doping concentration variation according to an exemplary embodiment of the invention.

FIG. 7 shows a schematic depth profile of an implant layer doping concentration variation in percent according to an exemplary embodiment of the invention. It is schematically shown that an absolute variation of the doping for a depth range from 0.00 µm to 0.20 µm is very small in a range from 101% to 96% (the ordinate in FIG. 7 extends between 90% and 102%). That means, the variation of the doping in the homogenous doping region 6a of the channel profile is at most 8% and ideally at most 4%.

While the invention has been illustrated and described in detail in the drawings and foregoing description, such illustration and description are to be considered illustrative or exemplary and not restrictive. The invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

The present application claims the priority of European Patent Application EP 20201762.0, the disclosure content of which is hereby incorporated by reference.

REFERENCE SIGNS LIST 1 power semiconductor device
2 bottom layer 3 drift layer
3a transition between drift layer and implant layer
4 source layer
5 insulated trench gate electrode
6 implant layer
6a homogeneous doping region
6b homogeneous doping region thickness
7 contact
8 insulating layer
9 substrate
s source
n net source
ci channel implant
CP implant layer doping concentration
ncd net channel doping
100 providing a drift layer of a first conductivity type
200 forming a source layer of the first conductivity type on the drift layer
300 forming an insulated gate trench electrode through the source layer into the drift layer
350 partially removing the source layer such that a section of the drift layer is uncovered
400 implanting ions of a second conductivity type into the drift layer to produce an implant layer
450 partially removing the source layer such that a section of the drift layer is uncovered

The invention claimed is:

1. A method for manufacturing a Silicon Carbide (SiC) power semiconductor device with an insulated trench gate electrode, comprising the steps of:
   providing a drift layer of a first conductivity type;
   forming a source layer of the first conductivity type on the drift layer;
   forming the insulated trench gate electrode which extends through the source layer into the drift layer;
   implanting ions of a second conductivity type, which is different than the first conductivity type into the drift layer to produce an implant layer of the second conductivity type with a homogeneous doping region having a doping variation of at most 8%, and
   partially removing the source layer such that a section of the drift layer is uncovered, wherein the homogeneous doping region is arranged between the source layer and the drift layer and has a homogeneous doping region thickness of at least 150 nm.

2. The method according to claim 1, wherein the homogeneous doping region has a doping concentration in a range from 2×1017 1/cm3 to 9×1017 1/cm3.

3. The method according to claim 1, wherein the homogeneous doping region thickness is at least 200 nm.

4. The method according to claim 1, wherein the homogeneous doping region thickness is at most 400 nm.

5. The method according to claim 1, wherein the implant layer has a thickness between 300 nm and 700 nm.

6. The method according to claim 1, wherein the step of implanting ions includes implanting ions for different depths, wherein doses for the different depths are obtained based on a numerical optimization.

7. The method according to claim 1, wherein the step of forming the insulated trench gate electrode is carried out before the step of implanting ions.

8. The method according to claim 1, wherein the step of forming the source layer is made by epitaxial growth.

9. The method according to claim 1, wherein the step of implanting ions includes a plurality of implantation substeps with different ion energies, so that a resulting doping profile within the implant layer is formed by a superposition of single implants.

10. The method according to claim 1, wherein the step of forming the insulated trench gate electrode is carried out after the step of implanting ions.

11. A power semiconductor device comprising:

a drift layer of a first conductivity type;

a source layer of the first conductivity type on the drift layer, wherein the source layer is partially removed prior or after an implantation step such that a section of the drift layer is uncovered;

an insulated trench gate electrode which extends through the source layer into the drift layer; and an implant layer of a second conductivity type different than the first conductivity type with a homogeneous doping region having a doping variation of at most 8%, which homogeneous doping region is arranged between the source layer and the drift layer and has a homogeneous doping region thickness of at least 150 nm.

12. The power semiconductor device according to claim 11, wherein the homogeneous doping region has a doping concentration in a range from $2 \times 1017$ 1/cm3 to $7 \times 10^{17}$ 1/cm3.

13. The power semiconductor device according to claim 11, wherein the homogeneous doping region thickness is at least 200 nm.

14. The power semiconductor device according to claim 11, wherein the homogeneous doping region thickness is at most 400 nm.

15. The power semiconductor device according to claim 11, wherein the variation of the doping concentration in the homogeneous doping region is at most 4%.

16. The power semiconductor device according to claim 11, wherein the source layer has a thickness between 50 nm and 150 nm.

17. The power semiconductor device according to claim 11, wherein the source layer has a thickness between 100 nm and 150 nm.

18. The power semiconductor device according to claim 11, wherein the source layer has a doping concentration between $1 \times 10^{18}$ 1/cm3 and $1 \times 10^{20}$ 1/cm3.

* * * * *